United States Patent
Venkata et al.

(10) Patent No.: US 9,515,880 B1
(45) Date of Patent: Dec. 6, 2016

(54) INTEGRATED CIRCUITS WITH CLOCK SELECTION CIRCUITRY

(75) Inventors: Ramanand Venkata, San Francisco, CA (US); Henry Y. Lui, Millbrae, CA (US); Victor Maruri, Mountain View, CA (US); David W. Mendel, Sunnyvale, CA (US); Andrew Bellis, Guildford (GB)

(73) Assignee: Altera Corporation, San Jose, CA (US)

( * ) Notice: Subject to any disclaimer, the term of this patent is extended or adjusted under 35 U.S.C. 154(b) by 664 days.

(21) Appl. No.: 13/338,898

(22) Filed: Dec. 28, 2011

(51) Int. Cl.
| | |
|---|---|
| *G06F 15/177* | (2006.01) |
| *G06F 1/00* | (2006.01) |
| *G06F 1/04* | (2006.01) |
| *G06F 15/16* | (2006.01) |
| *H04L 12/24* | (2006.01) |
| *G06F 1/10* | (2006.01) |
| *G06F 17/50* | (2006.01) |
| *G06F 9/445* | (2006.01) |

(52) U.S. Cl.
CPC ............ *H04L 41/0816* (2013.01); *G06F 1/10* (2013.01); *H04L 41/0813* (2013.01); *G06F 1/04* (2013.01); *G06F 9/44505* (2013.01); *G06F 17/5054* (2013.01)

(58) Field of Classification Search
CPC .......... H04L 41/0813; H04L 41/0816; G06F 9/44505; G06F 1/04; G06F 17/5054; G06F 1/10
USPC ............ 713/1, 500, 600; 709/220, 221, 200
See application file for complete search history.

(56) References Cited

U.S. PATENT DOCUMENTS

| | | | |
|---|---|---|---|
| 5,560,017 A * | 9/1996 | Barrett et al. ................. 710/260 |
| 5,680,594 A * | 10/1997 | Charneski et al. ........... 713/501 |
| 6,020,758 A * | 2/2000 | Patel et al. ...................... 326/40 |
| 6,028,446 A | 2/2000 | Agrawal et al. |
| 6,651,181 B1 | 11/2003 | Lacey |
| 6,721,872 B1 * | 4/2004 | Dunlop ................. G06F 13/387 |
| | | | 709/221 |
| 7,181,638 B2 * | 2/2007 | Welker et al. ................ 713/600 |
| 7,286,007 B1 | 10/2007 | Starr et al. |
| 7,310,459 B1 * | 12/2007 | Rahman ......................... 385/14 |
| 7,545,196 B1 | 6/2009 | Hutton et al. |
| 8,533,517 B2 * | 9/2013 | Gregie et al. ................. 713/500 |
| 2004/0255012 A1 * | 12/2004 | Kobayashi ............. H04L 29/06 |
| | | | 709/220 |
| 2008/0225887 A1 * | 9/2008 | Shiota et al. ................. 370/465 |
| 2008/0229136 A1 * | 9/2008 | Chelstrom et al. ........... 713/400 |
| 2009/0060531 A1 * | 3/2009 | Biegert et al. ................ 398/214 |
| 2011/0246810 A1 | 10/2011 | Wessel et al. |

\* cited by examiner

*Primary Examiner* — Ji H Bae
(74) *Attorney, Agent, or Firm* — Treyz Law Group; Jason Tsai; Vineet Dixit

(57) ABSTRACT

An integrated circuit device may include processing circuits that can be dynamically reconfigured to perform different tasks each of which utilizes different system clock resources. The device may include clock selection circuitry that can selectively route desired clock signals to corresponding processing circuits. The clock signal provided to each processing circuit may be selected based on a current configuration of that processing circuit. Client processing circuits in a network switch may be coupled to interchangeable client networks. The client processing circuits may be dynamically reconfigured based on characteristics of the client networks that are currently coupled to the network switch. By dynamically selecting which clock resources are provided to the processing circuits, clock resources such as global clock signals that are relatively scarce may be reserved for processing circuits that can only function with the relatively scarce clock resources. Arranged in this way, clock resource utilization may be continuously optimized.

21 Claims, 10 Drawing Sheets ns. In this scenario, if the optical client network is replaced by an Ethernet client network (e.g., a client network that transports data via Ethernet technologies), the client processing circuit may be dynamically reconfigured to process Ethernet data streams.

INTEGRATED CIRCUITS WITH CLOCK SELECTION CIRCUITRY

BACKGROUND

An integrated circuit often includes processing circuits that are configured to perform different tasks. For example, a programmable logic device may include circuits that can be reconfigured to implement different logic functions. The different processing circuits utilize system clock resources such as clock signals routed through associated clock paths.

System clock resources on an integrated circuit are typically limited. For example, a number of suitable clock signals available for use with a processing circuit decreases with increased logic complexity of the processing circuit. In a scenario in which many reconfigurable processing circuits are formed on a single programmable integrated circuit, the limited system clock resources must be shared among the reconfigurable processing circuits. Each configuration of the processing circuits may require different system clock resources. For example, a processing circuit configured in a first arrangement needs to be controlled using a first clock signal provided over a first clock path, whereas the processing circuit reconfigured in a second arrangement needs to be controlled using a second clock signal that is different than the first clock signals over a second clock path that is separate from the first clock path.

To accommodate reconfiguration of the processing circuits, conventional programmable integrated circuits reserve clock resources required by each configuration of each processing circuit. In the example above, the programmable integrated circuit reserves both first and second clock paths for the processing circuit even though only one of the first and second clock paths is used during normal operation of the integrated circuit. Providing multiple clock signals to the processing circuitry in this way may be inefficient and can waste valuable clock resources.

Therefore it may be desirable to provide improved distribution arrangements for system clock resources.

SUMMARY

A programmable integrated circuit device may include processing circuits that are dynamically reconfigured to perform different tasks each of which may require different system clock resources. The integrated circuit may include clock selection circuitry operable to dynamically route selected clock signals to corresponding processing circuits. The clock signal provided to each processing circuit may be selected based on a current configuration of that processing circuit.

As an example, a network switch may interface between multiple client networks and a high capacity network (e.g., a network with sufficient bandwidth to transmit data from the client networks). The network switch may process data streams from the high capacity network and provide the processed data streams to the client networks or process and merge data streams from the client networks and provide the merged data streams to the high capacity network. Each client network may be coupled to dynamically reconfigurable client processing circuits in the network switch. The client processing circuits may be dynamically reconfigured based on the characteristics of the corresponding client network. For example, a client processing circuit that is initially coupled to a client network that uses the Optical Transport Network standard to transport data via optical signals may be initially configured to process optical data streams. In this scenario, if the optical client network is replaced by an Ethernet client network (e.g., a client network that transports data via Ethernet technologies), the client processing circuit may be dynamically reconfigured to process Ethernet data streams.

By dynamically selecting which clock resources are provided to the processing circuits, clock resources such as global clock signals that are relatively scarce may be reserved for processing circuits that require global clock signals for proper operation. Dynamically allocating limited clock resources in this way may optimize clock resource utilization so that no clock resources are wasted.

Further features of the present invention, its nature and various advantages will be more apparent from the accompanying drawings and the following detailed description.

DETAILED DESCRIPTION

Embodiments of the present invention relate to integrated circuits with dynamic clock selection and routing circuitry.

An integrated circuit may include processing circuits that are configured to perform different tasks. For example, processing circuits may be configured to perform Ethernet packet processing, Optical Transport Network packet processing, audio/video processing, or other processing tasks. The programmable integrated circuit may have processing circuits that are dynamically reconfigured to implement user-defined logic functions. Each processing circuit may utilize different portions of system clock resources (e.g., each processing circuit may receive selected clock signals routed through respective paths).

Conventional programmable logic devices have predetermined clock routing paths (i.e., modules are provided with clock signals that are routed through fixed paths). Fixed clock routing paths may be undesirable in scenarios where the modules are dynamically reconfigured to perform different functions. Consider a scenario in which a module is dynamically reconfigured between a first configuration that requires a first clock signal and a second configuration that requires a second clock signal. The conventional programmable logic device has to modify the clock signal source directly in order to supply the module with the first clock signal or the second clock signal, because the module receives the clock signal source via a fixed path. This lack of flexibility can produce designs that inefficiently utilize resources on the integrated circuit.

To provide an integrated circuit with improved flexibility, clock selection circuitry may be formed that dynamically selects and routes clock signals to respective modules on the integrated circuit. The clock selection circuitry may help improve system clock resource utilization in scenarios where portions of the integrated circuit are dynamically reconfigured to perform different functions. The example of FIG. 1 shows an illustrative scenario in which an optical network switch 10 may perform different functions based on attributes of clients 14 that are coupled to network switch 10.

Figure 1:
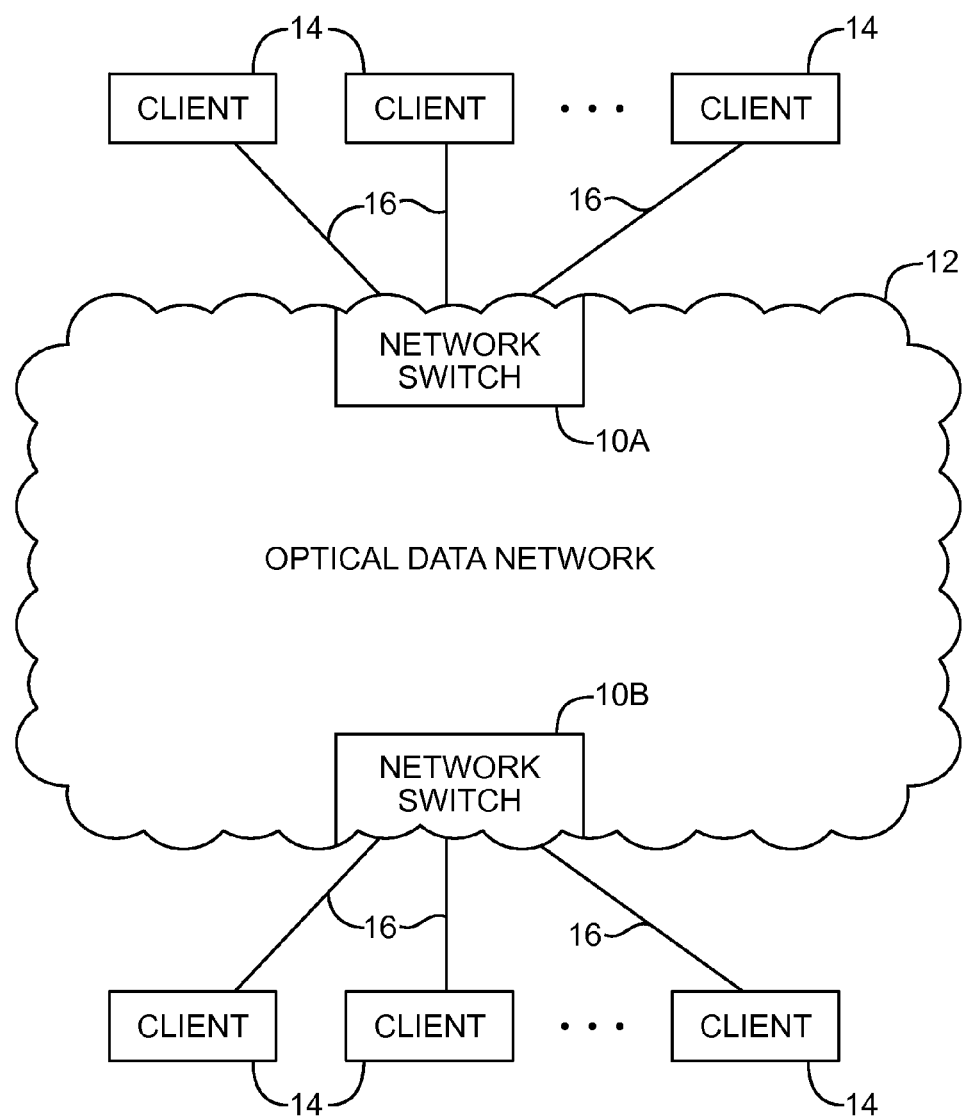
FIG. 1 is a diagram of an illustrative optical transport network with network switches in accordance with an embodiment of the present invention.

As shown in FIG. 1, network switch 10 may be part of an optical transport network 12 that has many network switches 10 (e.g., network switches 10A and 10B) each of which may be coupled to one or more clients 14. Network switches 10 may sometimes be referred to as optical network elements. The example of FIG. 1 in which network switch 10 is part of an optical transport network is merely illustrative. Network switch 10 may be part of any desirable transport network that routes network traffic through switches. Optical data network 12 may be used to transfer large amounts of data at high data rates (e.g., data rates of 10 Gigabits per second, 100 Gigabits per second, or more between clients 14 that are connected to the optical network). Optical data network 12 may be configured to use the synchronous optical network (SONET) standard, optical transport network (OTN) standard, or other network standards. Clients 14 may include other optical networks, Ethernet networks, or other data networks, and may sometimes be referred to herein as client networks. The switches and clients may be coupled via paths 16. Paths 16 may be formed from network cables such as optical fibers that carry optical network signals or category 5 cables that carry Ethernet network signals (as examples).

Network switches 10 may route network traffic between clients 14. For example, a first client 14 coupled to network switch 10A may send data to a second client 14 that is coupled to network switch 10B. Network switch 10A may receive the data from the first client and route the traffic through optical data network 12 to network switch 10B. Network switch 10B may receive the data and provide the data to the second client. In this way, clients 14 may send and receive data from other clients 14 that are coupled to optical data network 12 via switches 10.

Clients 14 may be formed from data networks that are different from optical data network 12. For example, a client 14 coupled to network switch 10A may be formed from an Ethernet network. In this scenario, Ethernet data packets provided by client 14 may be received by network switch 10A and converted into optical packets suitable for transport over optical data network 12. As another example, a client 14 coupled to network switch 10B may be formed from an optical data network with a slower transfer speed (line rate) than optical network 12 (e.g., client 14 may be an optical transport network two (OTU2) network with a line rate of approximately 10.70 gigabits per second and optical network 12 may be an optical transport network four (OTU4) network with a line rate of approximately 112 gigabits per second). In this scenario, network switch 10B may receive data transferred at relatively low data rates from client 14 and transmit the data at relatively high data rates suitable for use with optical network 12.

Figure 2:
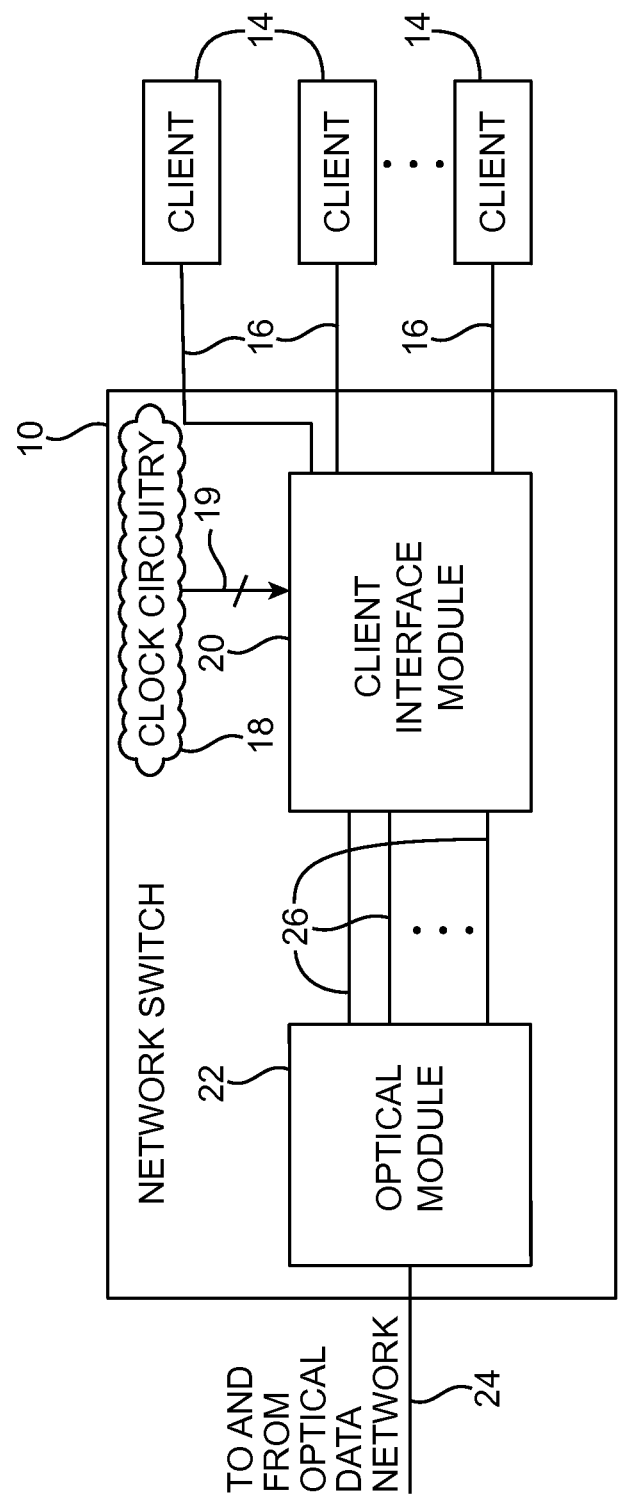
FIG. 2 is a diagram of an illustrative network switch in accordance with an embodiment of the present invention.

A network switch 10 that may be used to couple clients 14 to optical data network 12 is shown in FIG. 2. Network switch 10 may be formed as a single integrated circuit. As shown in FIG. 2, network switch 10 may include clock circuitry 18, an optical module 22, and a client interface module 20. Optical module 22 may be coupled to optical data network 12 via path 24 (e.g., an optical fiber link). The example of FIG. 2 showing optical module 22 and client interface module 20 as separate modules is merely illustrative. If desired, optical module 22 and client interface module 20 may be formed as a single module.

Optical module 22 may receive optical signals from optical data network 12 and distribute (or demultiplex) the optical signals into data streams that correspond to respective clients 14. For example, optical module 22 may receive data from optical data network 12 and demultiplex the received data by separating the received data into multiple data streams each corresponding to a respective client 14. Optical module 22 may provide the separated data streams to client interface module 20 via paths 26. Client interface module 20 may convert the separated data streams into client data streams suitable for transport over client networks 14.

Optical module 22 may receive network signals from clients 14 that are coupled to the network switch and combine (or multiplex) the optical signals into a single data stream for transport over optical data network 12 (e.g., by combining the relatively low-speed data streams from client networks 14).

Clock circuitry 18 may be coupled to client interface module 20 via paths 19 (e.g., circuitry may be used to provide clock signals to client interface module 20 via paths 19). Client interface module 20 may serve as an interface between client networks 14 and optical module 22. For example, clock circuitry 18 may provide clock signals with appropriate frequencies to process data received from Ethernet client networks or data received from optical client networks.

During the operation of network switch 10, any existing client 14 may be removed and/or replaced by a new client. For example, an optical client network 14 may be replaced by an Ethernet client network 14 during the operation of network switch 10 (e.g., while network switch 10 is processing data from other clients 14 that are still coupled to network switch 10). To accommodate different types of clients 14 that may be connected to client interface module during normal operation of network switch 10, clock circuitry 18 may be used to generate clock signals for each mode of operation (e.g., to generate clock signals with different frequencies such as Ethernet clock frequencies and optical clock frequencies).

Figure 3:
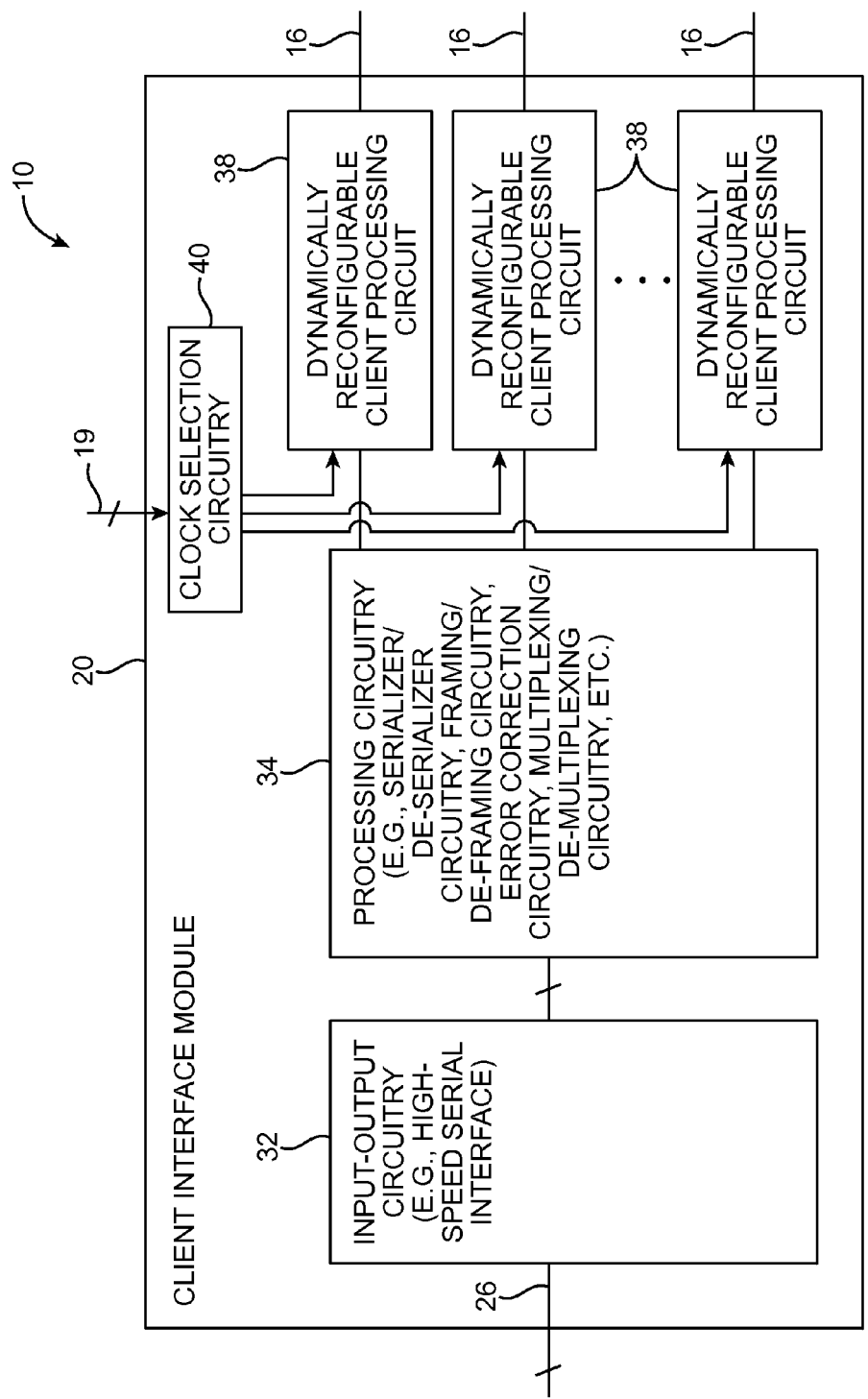
FIG. 3 is a diagram of an illustrative client interface module with dynamic clock signal routing capabilities in accordance with an embodiment of the present invention.

To provide network switch 10 with the capability of accommodating client networks 14 that are dynamically replaced or modified, client interface module 20 may be formed as shown in FIG. 3. As shown in FIG. 3, client interface module 20 may include input-output circuitry 32, processing circuitry 34, dynamically reconfigurable client processing circuits 38, and clock selection circuitry 40. Each dynamically reconfigurable client processing circuit 38 may be coupled to a respective client 14 via a corresponding path 16. Input-output circuitry 32 may include a high-speed serial interface to interface between optical module 22 and processing circuitry 34 (e.g., by receiving data from optical module 22 and converting the data into a serial bit stream for processing with circuitry 34 or by receiving data from processing circuitry 34 and converting the data into an optical data stream).

Processing circuitry 34 may process the high speed serial bit stream provided by input-output circuitry 32 in preparation for transmitting the data to clients 14 via paths 16. Processing circuitry 34 may include de-serializer circuitry that converts the serial bit stream provided by input-output circuitry 32 into multi-bit frames. For example, the de-serializer circuitry may convert a data stream into frames (e.g., optical transport network frames). Processing circuitry 34 may include de-framing circuitry that extracts transmission data from the frame (e.g., an optical data unit (ODU)). Processing circuitry 34 may include error correction circuitry that identifies transmission errors based on error correction bits in the frame. Processing circuitry 34 may include de-multiplexing circuitry configured to identify which one of clients 14 that are coupled to switch 10 should receive the data extracted from the frame (e.g., based on an address identified by frame headers). Processing circuitry 34 may provide the extracted data to the identified client 14 via a corresponding dynamically reconfigurable client processing circuit 38.

Dynamically reconfigurable client processing circuit 38 may receive data to be sent to a corresponding client network 14 (e.g., a client 14 coupled to that client processing circuit 38) and convert the data into data streams suitable for transport on the client network. Client processing circuit 38 may generate a client frame from the data (e.g., by adding appropriate protocol headers for the client network) and produce a corresponding client data stream. The client data stream may be transmitted to the client network via path 16.

The example of client interface module 20 receiving data from optical data network 12 and forwarding the data in an appropriate form to client 14 is merely illustrative. If desired, client interface module 20 may receive data from client networks 14 and forward the data to optical network 12 (e.g., by extracting client data from data streams received from clients 14, producing an optical frame from the client data with processing circuitry 34, and transmitting the optical frame via input-output circuitry 32 and optical module 22).

To accommodate dynamically interchangeable clients, dynamically reconfigurable client processing circuit 38 may be dynamically reconfigured (e.g., based on a type of a client 14 that is coupled to reconfigurable client processing circuit 38 via path 16). For example, a reconfigurable client processing circuit 38 that is coupled to an Ethernet client network 14 may be initially configured to accommodate Ethernet protocols. In this scenario, if an optical client network 14 is coupled to reconfigurable client processing circuit 38 (replacing the Ethernet client network), client processing circuit 38 may be dynamically reconfigured to accommodate optical transport networks. In other words, client processing circuit 38 may be reconfigured without powering down device 10 and while network switch 10 is communicating with other clients 14. Client processing circuit 38 may be reconfigured by reprogramming memory bits that provide static control output signals to control the states of logic components in circuitry 38 (as an example).

Clock selection circuitry 40 may receive clock signals from clock circuitry 18 via path 19. Clock selection circuitry 40 may be dynamically reconfigured to select appropriate clock signals and provide the selected clock signals to corresponding reconfigurable client processing circuits 38 for interfacing with client networks 14. The clock signals may be selected based on the type of transport protocol used by each client network 14 (e.g., because transport protocols used by different client networks 14 may have different data transfer rates). For example, an Ethernet client network 14 coupled to a first reconfigurable client processing circuit 38 may operate at approximately 10.3 gigabits per second, whereas an optical transport client network 14 coupled to a second reconfigurable client processing circuit 38 may operate at 10.7 gigabits per second. In this scenario, clock selection circuitry 40 may be reconfigured to route a first clock signal suitable for processing Ethernet data streams at 10.3 gigabits per second to first reconfigurable client processing circuit 38 and to route a second clock signal suitable for processing optical transport network data streams at 10.7 gigabits per second to second reconfigurable client processing circuit 38.

Figure 4:
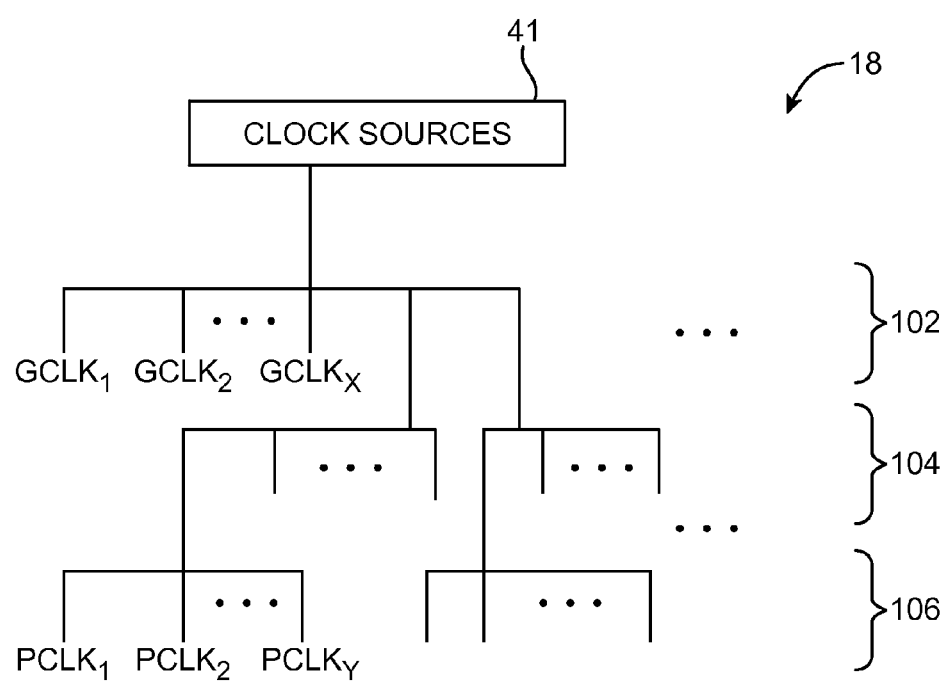
FIG. 4 is an illustrative diagram of a clock tree structure in accordance with an embodiment of the present invention.

The number of dynamically reconfigurable client processing circuits 38 (and therefore the number of client networks 14 that may be coupled to network switch 10) that may be formed in client interface module 20 may be limited by the number of available clock signals that are suitable for use with client networks 14. FIG. 4 shows an illustrative arrangement in which clock circuitry 18 may produce a limited number of suitable clock signals for use with dynamically reconfigurable client processing circuits 38. As shown in FIG. 4, clock circuitry 18 (sometimes referred to as a clock distribution network) may form a structure (e.g., a tree structure such as an H tree structure) that distributes clock signals generated using clock sources 41 (e.g., quartz piezo-electronic oscillators, phase-locked loops, or other clock generation components) to respective portions on device 10.

Clock distribution network 18 may be grouped into multiple levels each of which is suitable for providing clock signals to particular portions of device 10. For example, clock signals at a first level of the tree structure (e.g., level 102) may be global clock signals that are routed to the entire device, clock signals at a second level 104 (sometimes referred to as regional clock signals) that are routed to each quadrant of the device, and clock signals at a third level 106 (sometimes referred to as peripheral or local clock signals) may be routed to desired portions in each region. In the example of FIG. 4, global clock signals GCLK1, GCLK2, . . . , and GCLKX may be routed to the entire device, whereas peripheral clock signals PCLK1, PCLK2, . . . , and PCLKY may be routed to a partial region covering only $\frac{1}{8}^{th}$ of the device. Each level of the tree structure can have a greater number of available clock signals than a previous level (e.g., for any given module on the device, there may be more available quadrant clock signals than available global clock signals). The number of clock levels shown in FIG. 4 is merely illustrative. If desired, clock distribution network 18 may be grouped into any number of levels suitable for providing clock signals to circuits on network switch 10.

To conserve clock resources, it may be desirable to provide each processing circuit (e.g., each client processing circuit 38) with the lowest level of the clock tree that can accommodate the physical size of the module. For example, there may be only eight global clock signals available for use (i.e., X is equal to eight) while 10 peripheral clock signals may be available for each peripheral region (e.g., a peripheral region covering $\frac{1}{8}^{th}$ of device 10). In this scenario, it may be desirable to conserve global clock signals by allocating peripheral clock signals when suitable.

As an example, a client processing circuit 38 that is configured to process data streams for optical transport networks may be relatively complex and may utilize more resources in client interface module 20. In contrast, a configurable client processing circuit 38 that is configured to process data streams for Ethernet networks may be relatively simple and may utilize a minimal amount of resources in client interface module 20. Complex circuitry that utilizes more resources may occupy a relatively larger area on an integrated circuit than less complex circuitry that utilizes fewer resources. A configurable client processing circuit 38 configured to process Ethernet data streams may be physically small enough to be served by a peripheral clock signal (e.g., the area occupied by the client processing circuit 38 may be less than $\frac{1}{8}^{th}$ of the area of device 10). A configurable client processing circuit 38 configured to process optical transport network data streams may be too large to be served by a peripheral clock signal and may require use of a global clock signal (e.g., because the area occupied by client processing circuit 38 may be greater than $\frac{1}{8}^{th}$ of the area of device 10).

Figure 5:
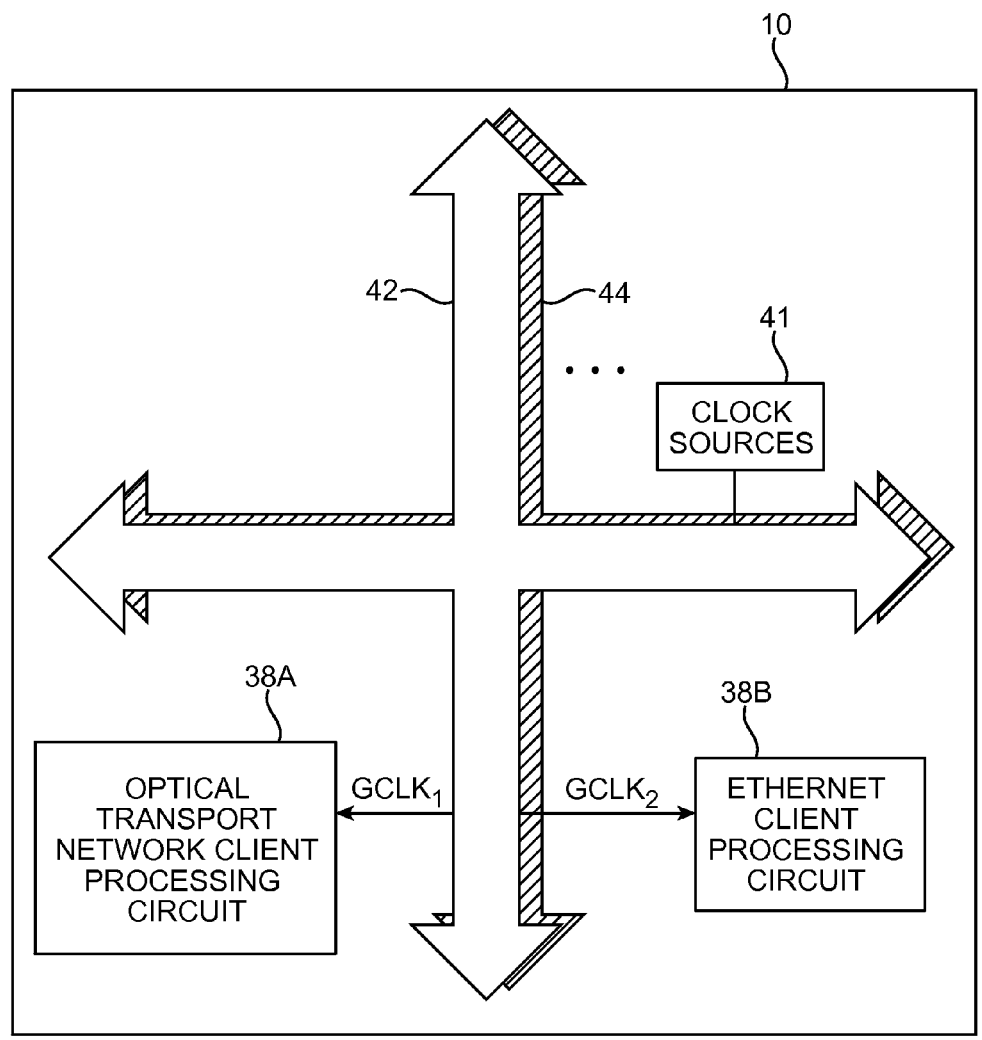
FIG. 5 is an illustrative diagram of global clock signal paths through which global clock signals may be distributed throughout an entire integrated circuit in accordance with an embodiment of the present invention.

FIG. 5 shows an illustrative arrangement in which global clock signals may be provided throughout an entire device 10. Device 10 may include optical transport network client processing circuit 38A (e.g., a dynamically reconfigurable client processing circuit 38 configured to process optical transport network data streams) and Ethernet client processing circuit 38B (e.g., a dynamically reconfigurable client processing circuit 38 configured to process Ethernet data streams).

As shown in FIG. 5, global clock paths 42 and 44 may route clock signals from clock sources 41 throughout device 10. For example, a first global clock signal (e.g., GCLK1 from FIG. 4) may be routed from clock sources 41 to optical transport network client processing circuit 38A via global clock path 42 and a second global clock signal (e.g., GCLK2) may be routed from clock sources 41 to Ethernet client processing circuit 38B via global clock path 44. Each clock path may be used to route one clock signal from clock sources 41. Therefore the use of global clock paths and global clock signals by client processing circuits 38A and 38B may result in inefficient use of available system clock resources (e.g., because the number of available global clock paths and global clock signals may be relatively limited).

Consider a scenario in which device 10 has only eight global clock paths. In this scenario, only six global clock paths may be used by other modules on device 10 (e.g., because two of the global clock paths are used by client processing circuits 38A and 38B).

Figure 6:
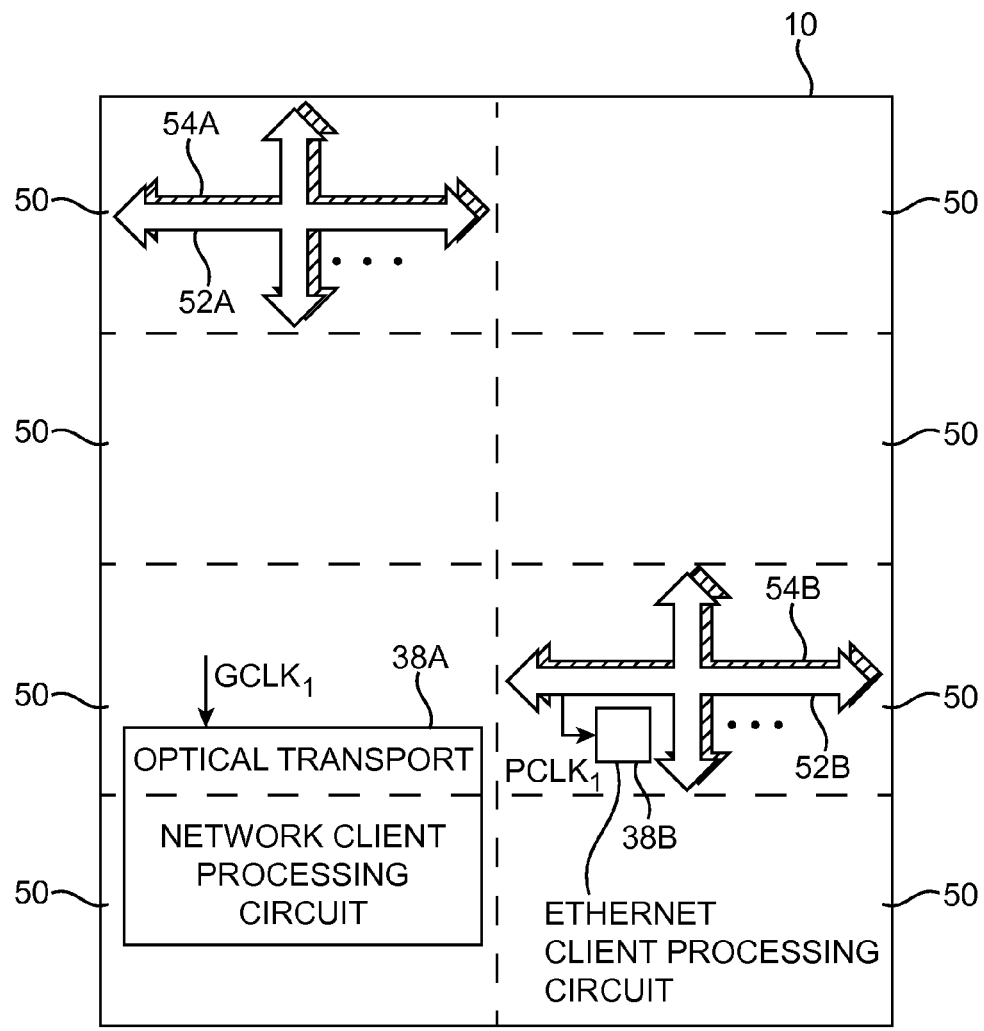
FIG. 6 is an illustrative diagram of peripheral clock signal paths through which peripheral clock signals are routed to selected portions of an integrated circuit in accordance with an embodiment of the present invention.

It may be desirable to use clock signals from lower levels of clock circuitry 18 (whenever possible) to conserve limited global clock resources. FIG. 6 shows an illustrative arrangement in which an Ethernet client processing circuit 38B is controlled using a peripheral clock signal (e.g., a clock signal from level 106 of FIG. 4) instead of a global clock signal.

As shown in FIG. 6, each region 50 of device 10 may be served using associated local (e.g., peripheral) clock paths. In the illustrative scenario of FIG. 6, each region 50 may cover one-eighth of the area of device 10. Peripheral clock signals may be routed throughout each region 50 by respective peripheral clock paths 52 (e.g., 52A and 52B) and 54 (e.g., 54A and 54B).

Optical transport network client processing circuit 38A may occupy an area that is too large to be handled using a peripheral clock signal (e.g., because optical transport network client processing circuit 38A is relatively complex) and may require use of global clock signal GCLK1 (e.g., as provided by global clock path 42 of FIG. 5).

In contrast, Ethernet client processing circuit 38B may occupy an area that is small enough to be handled using a peripheral clock signal (e.g., Ethernet client processing circuit has an area that is smaller than region 50). To conserve system clock resources, Ethernet client processing circuit 38B may be provided with a peripheral clock signal PCLK1 via peripheral clock signal path 52B.

To determine whether a module is small enough to receive a peripheral clock signal, the dimensions of the module may be considered. For example, if the width of a module is greater than both the width and height of a region 50, then the module may not be suitable for receiving a peripheral clock (e.g., even though the total area of the module may be less than the area of region 50). In other words, a module may be served using a peripheral clock signal if the module has a footprint that can fit entirely within the footprint of region 50.

To optimize the utilization of system clock resources, it may be desirable to dynamically select clock signals and corresponding clock paths based on the type of each module. For example, client processing circuit 38 that requires a global clock signal to process optical transport network data from an optical client network 14 may be dynamically reconfigured to use a peripheral clock signal when the optical client network 14 is replaced by an Ethernet network 14. As another example, client processing circuit 38 that is currently served using a peripheral clock signal to process Ethernet network data from an Ethernet client network 14 may be dynamically reconfigured to receive a global clock signal when the Ethernet client network 14 is replaced by an optical network 14.

Figure 7A:
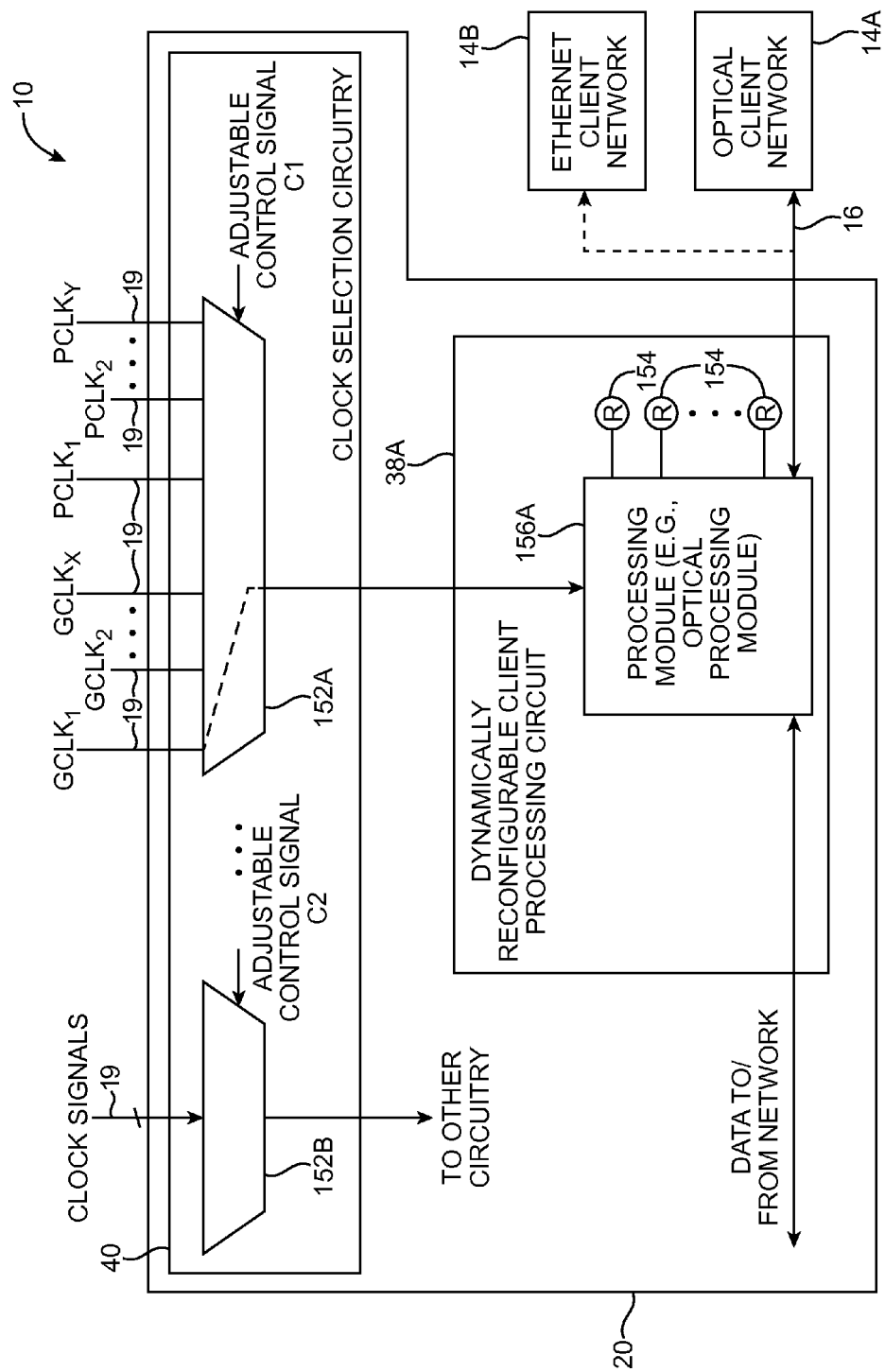
FIG. 7A is an illustrative diagram showing clock selection circuitry configured to dynamically route a global clock signal to a reconfigurable client processing circuit that is coupled to an optical client network in accordance with an embodiment of the present invention.

FIG. 7A shows an illustrative arrangement in which a network switch 10 may be provided with clock selection circuitry 40 for dynamically selecting clock signals and corresponding clock paths. In the example of FIG. 7A, an optical client network 14A may be coupled to dynamically reconfigurable client processing circuit 38A via path 16 and Ethernet client network 14B may be disconnected. To process data streams to and from optical client network 14A, dynamically reconfigurable client processing circuit 38A may be reconfigured to process optical data streams. For example, dynamically reconfigurable client processing circuit 38A may include memory elements 154 that provide corresponding control data bits that control the state of processing module 156A. Memory elements 154 may be dynamically loaded with configuration data to configure processing module 156A as an optical processing module operable to process optical transport network data streams.

Clock selection circuitry 40 may include multiplexing circuits 152A and 152B. The number of multiplexing circuits formed in clock selection circuitry 40 is merely illustrative. If desired, any number of multiplexing circuits may be formed in clock selection circuitry 40 (e.g., a multiplexing circuit may be formed for each dynamically reconfigurable client processing circuit 38 of FIG. 3 that receives a clock signal from clock selection circuitry 40).

Multiplexing circuits 152A and 152B may each receive clock signals (e.g., clock signals generated by clock sources 41 and provided to clock selection circuitry 40 via paths 19). Each multiplexing circuit may receive clock signals via clock routing paths (e.g., global clock paths 42 and 44 shown in FIG. 5, peripheral clock paths 52 and 54 as shown in FIG. 6, or other desirable clock paths). In the example of FIG. 7A, multiplexing circuit 152A may receive as inputs global clock signals GCLK1, GCLK2, . . . , GCLKX and peripheral clock signals PCLK1, PCLK2, . . . , PCLKY. Multiplexing circuitry 152A and 152B may be provided with respective adjustable control signals C1 and C2 that configure each of multiplexing circuitry 152A and 152B to selectively route one of its input clock signals to its output (e.g., to client processing circuit 38A connected at its output). Control signals C1 and C2 may include a number of control bits necessary to uniquely identify any given one of the clock signal inputs (e.g., three control bits may uniquely identify up to eight different input clock signals).

As an example, processing module 156A that is configured to process optical transport network data streams may be relatively complex and occupy a relatively large area on device 10 (e.g., as shown in FIG. 6). The relatively large area occupied by processing module 156A may be too large to be handled using peripheral clock signals (e.g., because the area occupied by processing module 156A may occupy an area greater than the area covered by any given peripheral clock signal path). In this scenario, optical processing module 156A may require a global clock signal conveyed over a clock path that provides coverage for at least the area of device 10 that is occupied by optical processing module 156A. Adjustable control signal C1 may be adjusted to route global clock signal GCLK1 through multiplexing circuitry 152A to processing module 156A.

Figure 7B:
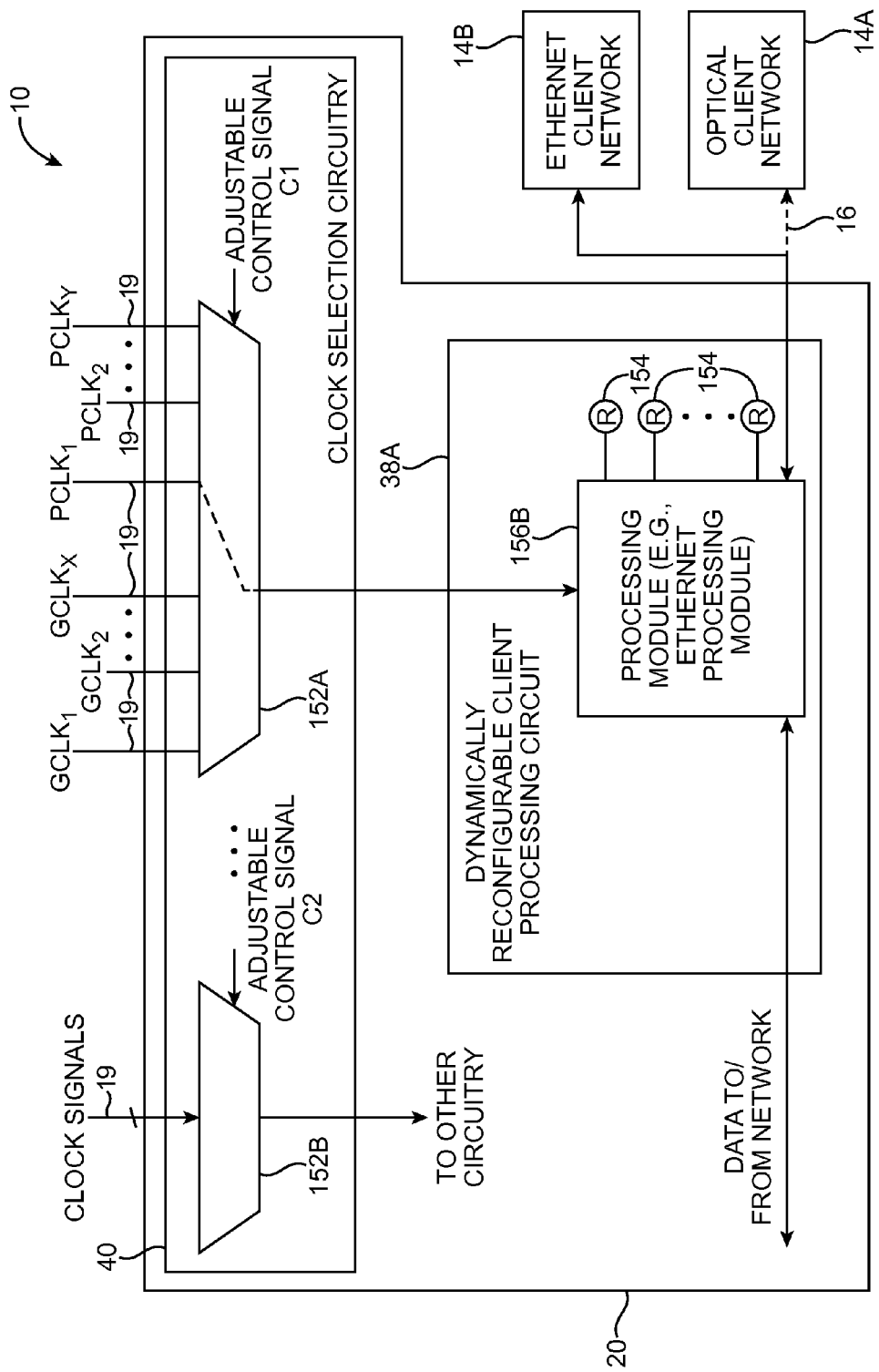
FIG. 7B is an illustrative diagram showing clock selection circuitry configured to dynamically route a peripheral clock signal to a reconfigurable client processing circuit that is coupled to an Ethernet client network in accordance with an embodiment of the present invention.

Adjustable control signals C1 and C2 may be dynamically adjusted during the operation of network switch 10. FIG. 7B shows a scenario in which adjustable control signal C1 may be dynamically adjusted to accommodate reconfiguration of client processing circuit 38A. In the example of FIG. 7B, optical client network 14A may be replaced by an Ethernet client network 14B (e.g., Ethernet client network 14B may be coupled to processing module 156B instead of optical client network 14A). To process Ethernet data streams to and from Ethernet network 14B, processing module 156B may be dynamically reconfigured to process Ethernet data streams. For example, a processing module 156A that is initially configured to process optical data streams may be dynamically reconfigured when optical client network 14A is replaced by Ethernet client network 14B. To reconfigure processing module 156A, appropriate configuration data may be loaded into memory elements 154 (e.g., configuration bits may be loaded that change the state of logic elements in processing module 156A so that processing module 156A is provided with Ethernet processing functionality instead of optical processing functionality).

Ethernet processing module 156B of FIG. 7B may utilize relatively fewer system resources and occupy a relatively small area. For example, Ethernet processing module 156B may use fewer system resources than optical processing module 156A of FIG. 7A. In this scenario, a peripheral clock signal such as PCLK1 may be suitable for use with processing module 156B (e.g., because peripheral clock signal paths associated with PCLK1 may cover a large enough area of device 10 to route PCLK1 throughout the area occupied by Ethernet processing module 156B). Adjustable control signal C1 may be adjusted to direct multiplexing circuitry 152A to route a peripheral clock signal such as PCLK1 to Ethernet processing module 156B. By routing peripheral clock signal PCLK1 to Ethernet processing module 156B instead of global clock signal GCLK1, system clock resources may be conserved (e.g., because device 10 may have fewer available global clock signals than available peripheral clock signals).

By adjusting control signal C1, the clock signal provided to client processing circuit 38A may be dynamically selected based on attributes of the client processing circuit (e.g., based on the area occupied by client processing circuit 38A) or based on the configuration of the client processing circuit (e.g., based on whether client processing circuit 38A is configured to process optical data streams or Ethernet data streams).

Figure 8:
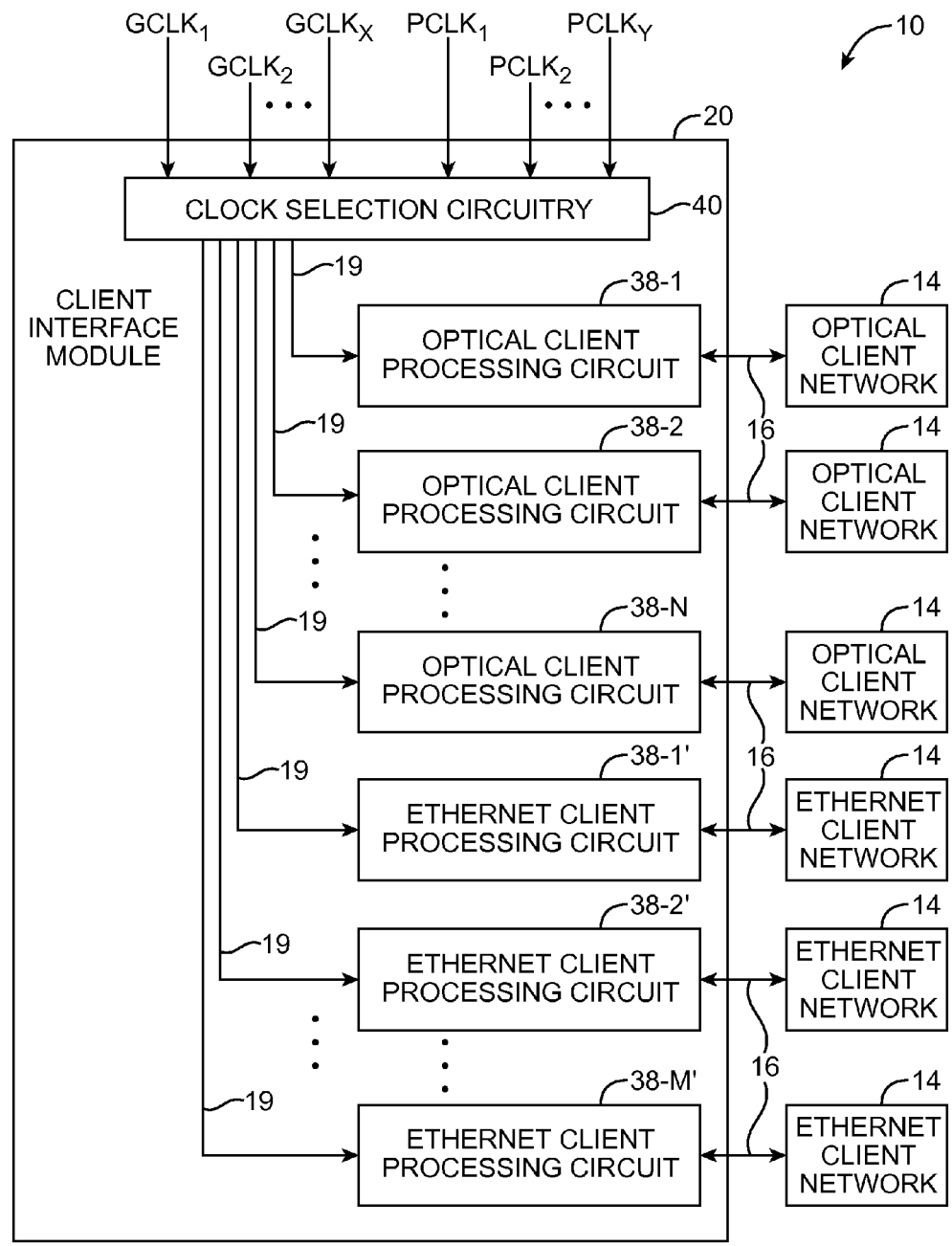
FIG. 8 is a diagram showing a device with clock selection circuitry configured to dynamically route clock signals to reconfigurable client processing circuits in accordance with an embodiment of the present invention.

By providing device 10 with the capability of dynamically selecting clock signals, device 10 may be provided with improved flexibility. FIG. 8 shows an illustrative arrangement in which dynamic selection of clock signals may allow device 10 to accommodate an increased number of simultaneously connected client networks 14 (e.g., a number of simultaneously connected client networks equal to the total number of global clocks signals and peripheral clock signals). In the example of FIG. 8, device 10 may have available global clock signals GCLK1, GCLK2, . . . , GCLKX and available peripheral clock signals PCLK1, PCLK2, . . . , PCLKY. The available clock signals may be provided to clock selection 40 in client interface module 20. Clock selection circuitry may be configured to route the available clock signals to dynamically reconfigurable client processing circuits 38 (e.g., client processing circuits 38-1, 38-2, . . . , 38-N, 38-1', 38-2', . . . , and 38-M') via paths 19. Device 10 may be formed with at least N optical client processing circuits and M Ethernet client processing circuits.

The clock signals routed to each of the client processing circuits may be dynamically selected based on current configurations of the client processing circuits. For example, global clock signals may be routed to client processing circuits that are configured to interface with optical client networks, whereas peripheral clock signals may be routed to client processing circuits that are configured to interface with Ethernet client networks. The number of optical client processing circuits 38 that may be formed in device 10 (and therefore the number of optical client networks that may be coupled to device 10) may be limited by the total number of available global clock signals. For example, N may be limited to a number less than or equal to X. The number of Ethernet client processing circuits 38 that may be formed in device 10 may be limited by the total number of available global clock signals, the total number of available peripheral clock signals, and the number of optical client processing circuits 38. For example, M may be limited to a number less than or equal to X plus Y minus N.

For example, in a scenario in which eight global clock signals and ten peripheral clock signals are provided to clock selection circuitry 40 (e.g., X is eight and Y is ten), a maximum of eight optical client processing circuits may be formed (e.g., because optical client processing circuits may only be suitable for use with global clock signals). In this scenario, the maximum number of Ethernet client processing circuits that may be formed in addition to the optical client processing circuits may be equal to the total number of global and peripheral clock signals (e.g., X+Y) minus the number of configured optical client processing circuits (e.g., because Ethernet client processing circuits may receive either global or peripheral clock signals).

Figure 9:
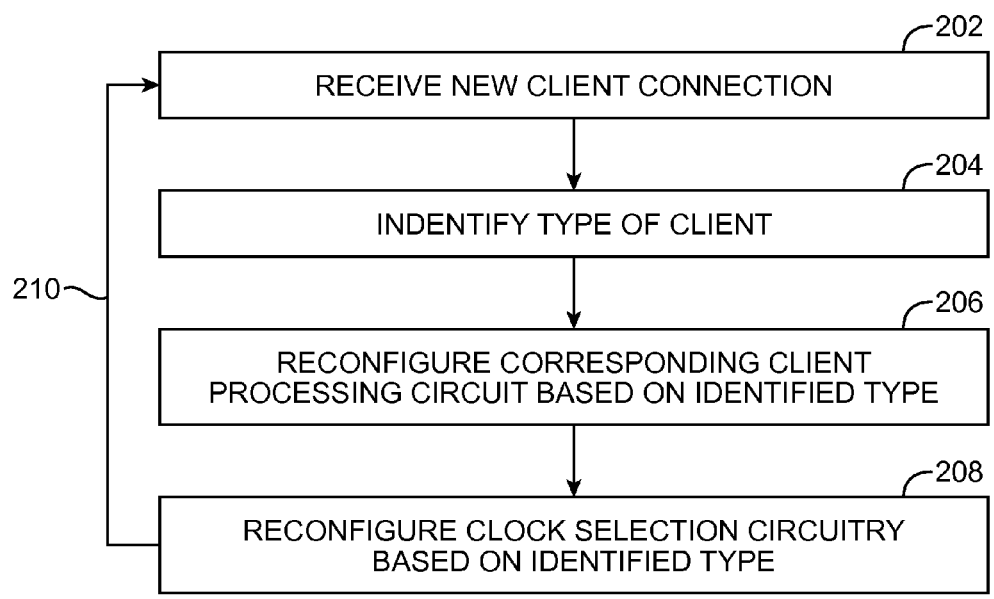
FIG. 9 is a flow chart of illustrative steps for dynamically selecting and routing clock signals in accordance with an embodiment of the present invention.

FIG. 9 shows illustrative steps that may be performed by a device such as network switch 10 to dynamically select clock signals based on configurations of client processing circuitry.

In step 202, a dynamically reconfigurable client processing circuit 38 of network switch 10 may be coupled to a new client network 14 (e.g., a new optical or Ethernet client network 14 may be coupled to network switch 10). New client network 14 may be coupled to a dynamically reconfigurable client processing circuit 38 that is currently unused or coupled to a client processing circuit 38 in place of a connection to an existing client network 14 (as examples).

In step 204, network switch 10 may identify a type of the new client network 14. For example, network switch 10 may identify that the client network 14 is an optical client network or an Ethernet client network.

In step 206, network switch 10 may dynamically reconfigure client processing circuit 38 to accommodate new client network 14. The client processing circuit may be reconfigured based on characteristics of the new client (e.g., a network type of the new client). For example, network switch 10 may reconfigure client processing circuit 38 to process optical data streams to accommodate an optical client network 14.

In step 208, network switch 10 may dynamically reconfigure clock selection circuitry 40 to provide appropriate clock signals to client processing circuit 38. Clock selection circuitry 40 may be reconfigured (e.g., by adjusting control signals provided to multiplexing circuitry 152 to route a desired clock signal to the client processing circuit). The desired clock signal may be selected based on the availability of clock resources such as clock signals and clock routing paths. For example, clock signals that are currently being routed to other circuitry (e.g., other client processing circuits 38 that are coupled to other client networks) may not be selected. The process may then return to step 202 via path 210 to continuously accept new client connections.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   clock generation circuitry that supplies at least first and second clock signals, wherein the first clock signal is a global clock signal, and wherein the second clock signal is a local clock signal;
   reconfigurable circuitry with configurations corresponding to at least first and second modes, wherein the reconfigurable circuitry is coupled to a first type of client network in the first mode, and wherein the reconfigurable circuitry is coupled to a second type of client network that is different than the first type of client network in the second mode; and
   a clock selection circuit that routes the first clock signal to the reconfigurable circuitry when the reconfigurable circuitry is configured to operate in the first mode and that routes the second clock signal to the reconfigurable circuitry when the reconfigurable circuitry is configured to operate in the second mode.

2. The integrated circuit, defined in claim 1 wherein the reconfigurable circuitry is operable to dynamically switch between the first and second configurations in real time during normal operation of the integrated circuit.

3. The integrated circuit defined in claim 1 wherein the clock selection circuit is operable to receive at least one adjustable control signal that directs the clock selection circuit to route the first clock signal from the clock generation circuitry to the reconfigurable circuitry during the first mode and that directs the clock selection circuit to route the second clock signal from the clock generation circuitry to the reconfigurable circuitry during the second mode.

4. The integrated circuit defined in claim 1 wherein the reconfigurable circuitry is operable to process Ethernet packets in the first mode and operable to process Optical Transport Network packets in the second mode.

5. The integrated circuit device defined in claim 1 wherein the reconfigurable circuitry includes memory elements operable to be dynamically loaded with configuration data that configures the reconfigurable circuitry in one of the first and second configurations during normal operation of the integrated circuit.

6. The integrated circuit defined in claim 1 wherein the clock selection circuit comprises multiplexing circuitry operable to receive the first and second clock signals and further operable to route the first clock signal to the reconfigurable circuitry in the first mode and to route the second clock signal to the reconfigurable circuitry in the second mode.

7. The integrated circuit defined in claim 1, wherein the reconfigurable circuitry receives the first clock signal at a processing module having a first area in the first mode, wherein the reconfigurable circuitry receives the second clock signal at a reconfigured processing module having a second area in the second mode, and wherein the first area is less than the second area.

8. The integrated circuit defined in claim 1, wherein the reconfigurable circuitry is disconnected from the second client network in the first mode, and wherein the reconfigurable circuitry is disconnected from the first client network in the second mode.

9. A method of operating an integrated circuit that includes clock generation circuitry operable to produce a plurality of clock signals and that includes a plurality of circuits, wherein each circuit in the plurality of circuits comprises memory elements, the method comprising:
   receiving data packets of a first type at a given circuit in the plurality of circuits, wherein the first type of packets comprise optical network packets;
   identifying that the given circuit in the plurality of circuits is to be reconfigured;
   reconfiguring the given circuit during the operation of the integrated circuit by loading the memory elements that are associated with the given circuit with different sets of configuration data during operation of the integrated circuit;
   in response to reconfiguring the given circuit, receiving data packets of a second type that is different than the first type at the given circuit, wherein the second type of packets comprise Ethernet packets;
   converting the data packets of the second type into data packets of the first type at the given circuit; and
   with a clock selection circuit, routing a selected one of the plurality of clock signals from the clock generation circuitry to the given circuit.

10. The method defined in claim 9, further comprising:
    while receiving the data packets of the first type at the given circuit, receiving a first clock signal at the given circuit; and
    while receiving the data packets of the second type at the given circuit, receiving a second clock signal at the given circuit that is different from the first clock signal.

11. A method of operating an integrated circuit comprising:
  with clock circuitry, generating at least first and second clock signals, wherein the first clock signal comprises a local clock signal that is routed to a selected portion of the integrated circuit, and wherein the second clock signal comprises a global clock signal that is routed across the entirety of the integrated circuit;
  with clock selection circuitry, routing the first clock signal to dynamically reconfigurable circuitry operating in a first mode, wherein the dynamically reconfigurable circuitry processes a first type of data stream in the first mode;
  when the dynamically reconfigurable circuitry is operating in the first mode, reconfiguring the dynamically reconfigurable circuitry to operate in a second mode, wherein the dynamically reconfigurable circuitry processes a second type of data stream that is different than the first type of data stream in the second mode; and
  in response to detecting that the dynamically reconfigurable circuitry is operating in the second mode, dynamically rerouting the second clock signal to the dynamically reconfigurable circuitry.

12. The method defined in claim 11 further comprising:
  configuring the dynamically reconfigurable circuitry in a first arrangement so that the dynamically reconfigurable circuitry is operable in the first mode; and
  reconfiguring the dynamically reconfigurable circuitry in a second arrangement that is different than the first arrangement so that the dynamically reconfigurable circuitry is operable in the second mode.

13. The method defined in claim 11 further comprising:
  switching the dynamically reconfigurable circuitry between first and second configurations in real time during operation of the integrated circuit.

14. The method defined in claim 11, wherein configuring the dynamically reconfigurable circuitry to process the first type of data stream comprises configuring the dynamically reconfigurable circuitry to processes Ethernet data streams, and wherein configuring the dynamically reconfigurable circuitry to process the second type of data stream comprises reconfiguring the dynamically reconfigurable circuitry to processes Optical Transport Network data streams.

15. The method defined in claim 11 wherein the clock selection circuitry comprises multiplexing circuitry operable to receive the first and second clock signals, wherein routing the first clock signal to the dynamically reconfigurable circuitry comprises routing the first clock signal to the dynamically reconfigurable circuitry with the multiplexing circuitry, and wherein routing the second clock signal to the dynamically reconfigurable circuitry comprises routing the second clock signal to the dynamically reconfigurable circuitry with the multiplexing circuitry.

16. The method defined in claim 13 wherein the clock selection circuitry receives at least one control signal, the method further comprising:
  adjusting the control signal so that the clock selection circuitry routes the first clock signals from the clock circuitry to the dynamically reconfigurable circuitry during the first mode; and
  adjusting the control signal so that the clock selection circuitry routes the second clock signal from the clock circuitry to the dynamically reconfigurable circuitry during the second mode.

17. The method defined in claim 13 wherein the dynamically reconfigurable circuitry includes memory elements and wherein switching the dynamically reconfigurable circuitry between the first and second configurations comprises:
  loading the memory elements with a first set of configuration data to place the dynamically reconfigurable circuitry in the first configuration; and
  loading the memory elements with a second set of configuration data that is different than the first set of configuration data to place the dynamically reconfigurable circuitry in the second configuration.

18. The method defined in claim 9, wherein converting the data packets comprises:
  converting Ethernet data packets received from an Ethernet client into Optical Transport Network data packets.

19. The method defined in claim 9 wherein reconfiguring the given circuit comprises configuring the given circuit to process Ethernet packets.

20. The method defined in claim 9 further comprising:
  receiving a network connection from a network having a network type, wherein identifying that the given circuit of the plurality of circuits is to be reconfigured comprises identifying the network type.

21. The method defined in claim 9, wherein routing the selected one of the plurality of clock signals from the clock generation circuitry to the given circuit comprises:
  with the clock selection circuit, routing a first clock signal in the plurality of clock signals from the clock generation circuitry to the given circuit when the given circuit is configured using a first set of configuration data; and
  with the clock selection circuit, routing a second clock signal in the plurality of clock signals that is different than the first clock signal from the clock generation circuitry to the given circuit when the given circuit is configured using a second set of configuration data that is different than the first set of configuration data.

* * * * *